United States Patent [19]
Foley

[11] 4,403,406
[45] Sep. 13, 1983

[54] COMPONENT POSITION INDICATOR FOR ELECTRONIC COMPONENT INSERTION STATION

[75] Inventor: Michael S. Foley, Beverly, Mass.

[73] Assignee: USM Corporation, Farmington, Conn.

[21] Appl. No.: 20,709

[22] Filed: Mar. 15, 1979

[51] Int. Cl.³ .............................................. B23P 21/00
[52] U.S. Cl. ................................ 29/721; 29/566.3; 29/741; 29/833; 140/93 D
[58] Field of Search ............ 83/200; 140/71 R, 93 D, 140/93 R, 1; 353/28; 29/720, 407, 392, 721, 833, 835, 837, 838, 566.3, 741; 356/399, , 401; 250/227, 518

[56] References Cited
U.S. PATENT DOCUMENTS

| | | | |
|---|---|---|---|
| 3,414,024 | 12/1968 | Anderson et al. | 140/1 |
| 3,548,493 | 12/1970 | Hubbard | 29/721 |
| 3,611,544 | 10/1971 | Frels et al. | 29/721 |
| 3,621,554 | 11/1971 | Feldman | 29/833 |
| 3,667,104 | 6/1972 | Chamillard | 29/721 |
| 3,710,477 | 1/1973 | Frawley | 29/721 |
| 4,153,082 | 5/1979 | Foley | 83/200 |

Primary Examiner—Daniel C. Crane
Attorney, Agent, or Firm—Alan N. McCartney

[57] ABSTRACT

Equipment to visually identify insertion points to an operator of a pre-programmed, semi-automatic electronic assembly station. This equipment includes a pair of illuminators disposed at opposite ends of a cut-clinch mechanism and arranged to shine on the underside of the circuit board. The illuminators are carried by the cut-clinch mechanism and are free to move transversely and rotate axially, as the mechanism rotates and moves during the assembly steps.

11 Claims, 4 Drawing Figures

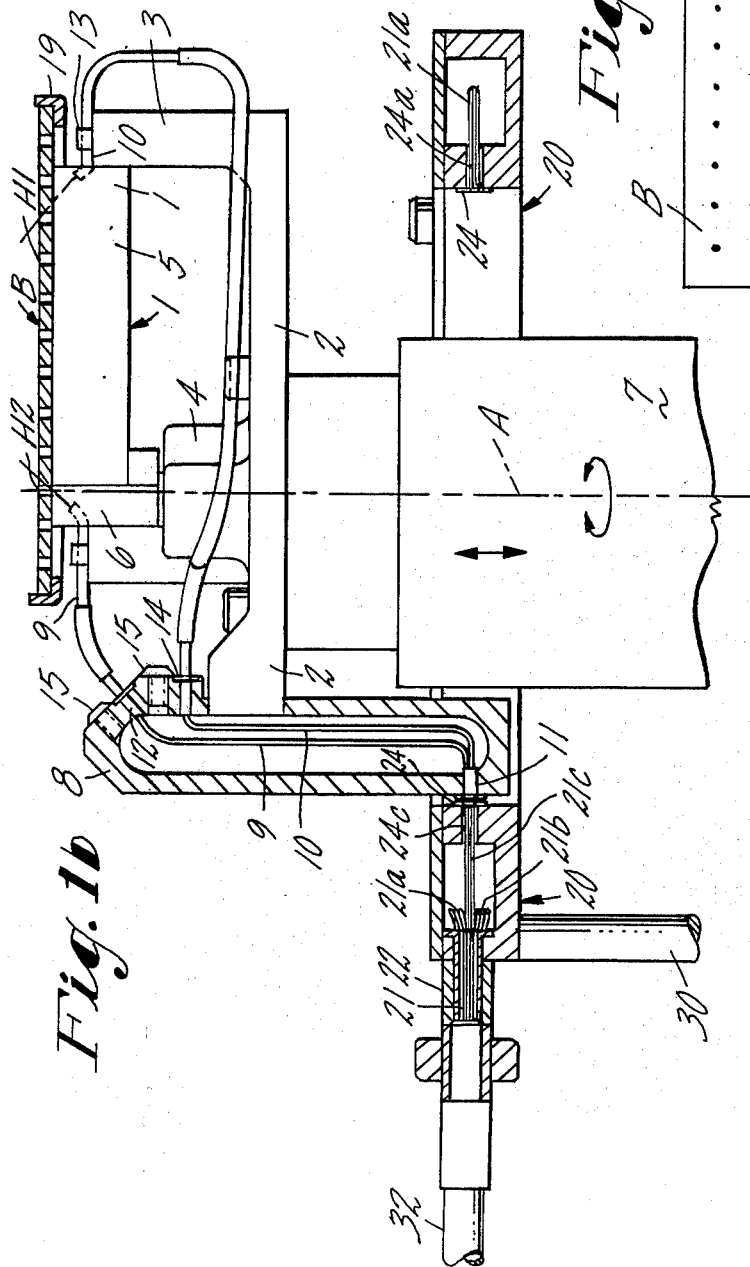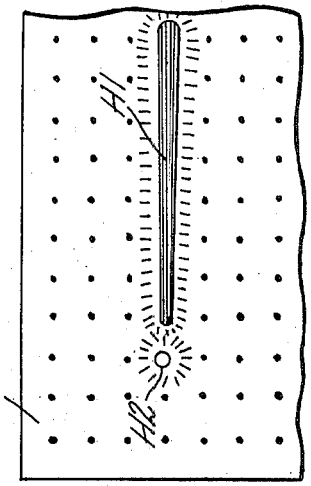

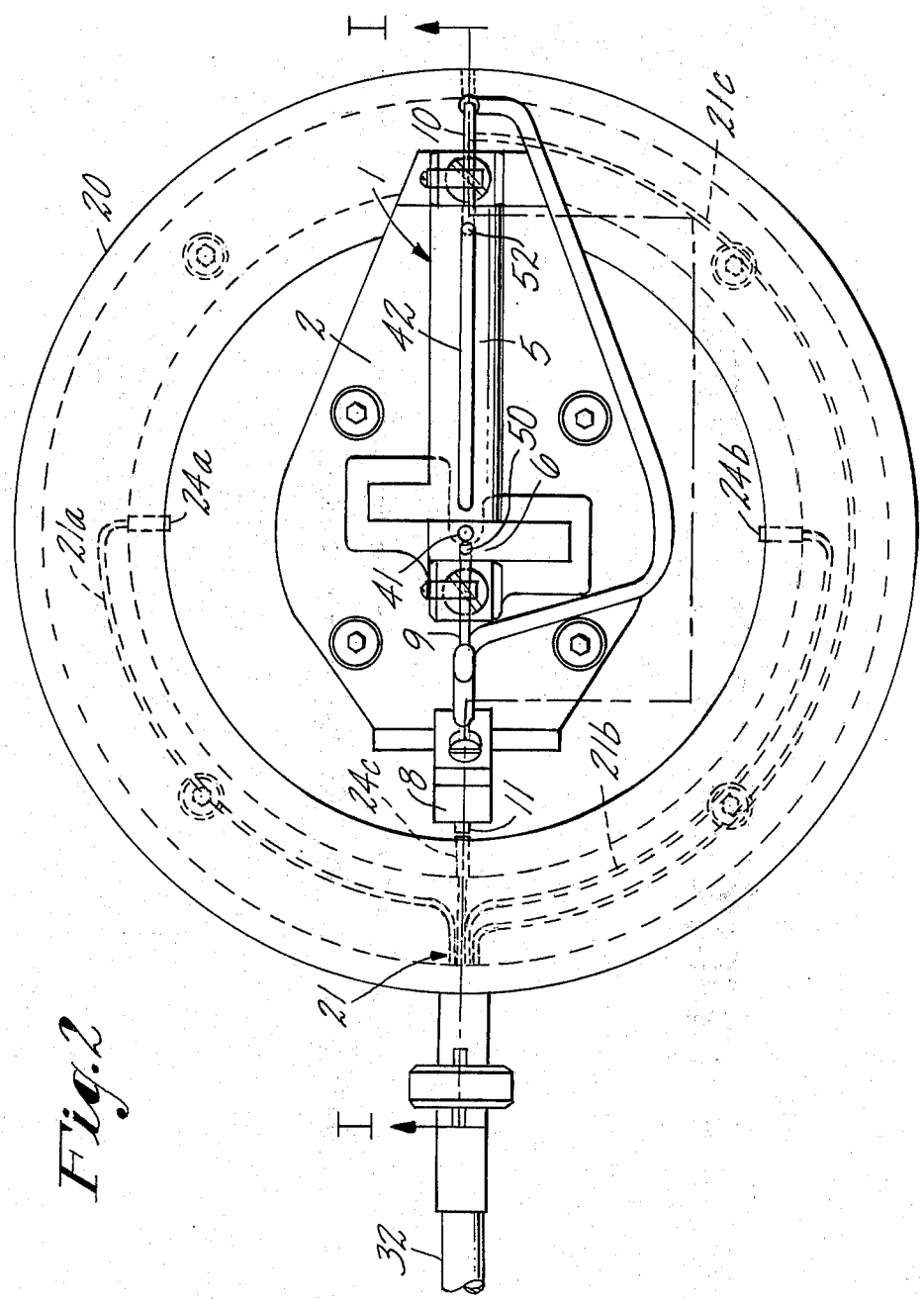

COMPONENT POSITION INDICATOR FOR ELECTRONIC COMPONENT INSERTION STATION

BACKGROUND OF THE INVENTION

The present invention relates to equipment for use with semi-automatic printed circuit board insertion stations and particularly to a mechanism for informing the operators of such stations as to the appropriate holes into which the lead-in wires of an electronic component are to be inserted. Such stations can be constructed as disclosed in U.S. Pat. No. 4,153,082 wherein I disclose a semi-automatic cut-clinch mechanism for inserting lead-in wires of electrical components into circuit boards. The disclosure of U.S. Pat. No. 4,153,082 is incorporated herein by reference and forms part of the disclosure of this application. The station involves a stationary support for a pair of cutting-bending levers of different lengths rotatable about a common axis. A vertical through-hole and slot is aligned with a corresponding hole and slot in a support to receive leads of the component. Relative counter rotation of the holes and slots cuts and clinches the leads of the component to secure it to the circuit board. The movement shears the lead-in wires and bends them generally perpendicular to the axis of the body and in opposite directions to each other. Power is provided to angularly orient the cut-clinch mechanism as a unit in order to accommodate different axial orientations of the component being processed. Such equipment requires the operator to insert each component manually on the board and it is essential that the person knows the correct holes into which to place the lead-in wires.

SUMMARY OF THE PRIOR ART

With the semi automatic system that was disclosed in my patent mentioned above, the stationary mounted printed circuit board has a program controlled cut and clinch device disposed beneath it. The cut and clinch device is moved about the underside of the printed circuit board to cut and clinch the component lead-in wires when they are manually inserted in holes. It therefore becomes necessary to indicate to the operator the proper lead-in wire locations for each programmed component to be inserted.

Several systems for indicating the position of the component have been disclosed to the art. These have included illuminators mounted above the printed circuit board and the light from the illuminator is directed upon the circuit board to illustrate the intended location of the component. As can be realized, when the operator moves a hand between the illuminator and the circuit board, the light beam is disrupted and component insertion is made less reliable because a mistake can be made during the operation. In addition, certain other devices of the prior art have used preset, masked illuminators which are shuttled beneath the printed circuit board to identify the appropriate location. Such mechanisms involve the use of complicated equipment which is subject to possible failure.

SUMMARY OF THE INVENTION

According to the present invention I have devised novel equipment for securing an electronic component to a circuit board and indicating to the operator where the components should be inserted. The equipment includes a support for the board which establishes a reference plane and a securing mechanism for affixing the component thereto. The securing mechanism is movable relative to the support along a line that is normal to the plane and an illuminator is carried with the securing mechanism and disposed on the same side of the plane as the securing mechanism to illuminate an aperture of a circuit board that is substantially aligned with the line to indicate the intended location for one of the lead-in wires. In the preferred embodiment, the securing mechanism is arranged to revolve about an axis of rotation on the line mentioned above. The illuminator is divided into two parts, the first of which is arranged to shine through the circuit board and illuminate the aperture centered on the axis of rotation, and the other being spaced from the first and arranged to cast a line of light through the circuit board toward the axis so as to indicate the radial direction for insertion of the second lead-in wire of the component.

To bring light to the illuminator, I dispose a toroidal bundle of optical fibers in a ring that is connected to an exterior source of high intensity light. The bundle is quadrificated within the ring and each of the quadrifications is directed to equidistantly space light outlet ports that are disposed on the inside of the ring. A cut and clinch mechanism is disposed within the ring and carries a rigid tube that contains another bundle of optical fibers. When the cut and clinch mechanism is elevated directly beneath the printed circuit board, an inlet port on the tube aligns itself with one of the four outlet ports and transmits light to two illuminators that are disposed at opposite ends of the cut and clinch mechanism. When the operator of the printed circuit board assembly station is using the equipment, the illumination appears as a bright light through one hole in the circuit board and a line of lesser brilliance light directed towards that hole. Since most printed circuit boards have some translucency, they allow light from the second illuminator to pass through and the operator can clearly see both one hole in which the component lead is to be inserted and a line of light indicating its radial orientation.

DESCRIPTION OF THE DRAWINGS

FIGS. 1a and 1b are partial cross-sectional views taken along the line I—I of FIG. 2 and shows the disposition of the illuminators with reference to the circuit board at two stages of operation.

FIG. 2 is a top plan view of the cut and clinch mechanism and the insertion-indicator-illuminators.

FIG. 3 is a fragmentary view of a portion of a circuit board illustrating the light pattern of the illuminators on the printed circuit board when viewed from the top by an operator.

DESCRIPTION OF THE PREFERRED EMBODIMENTS

Figure 1A:
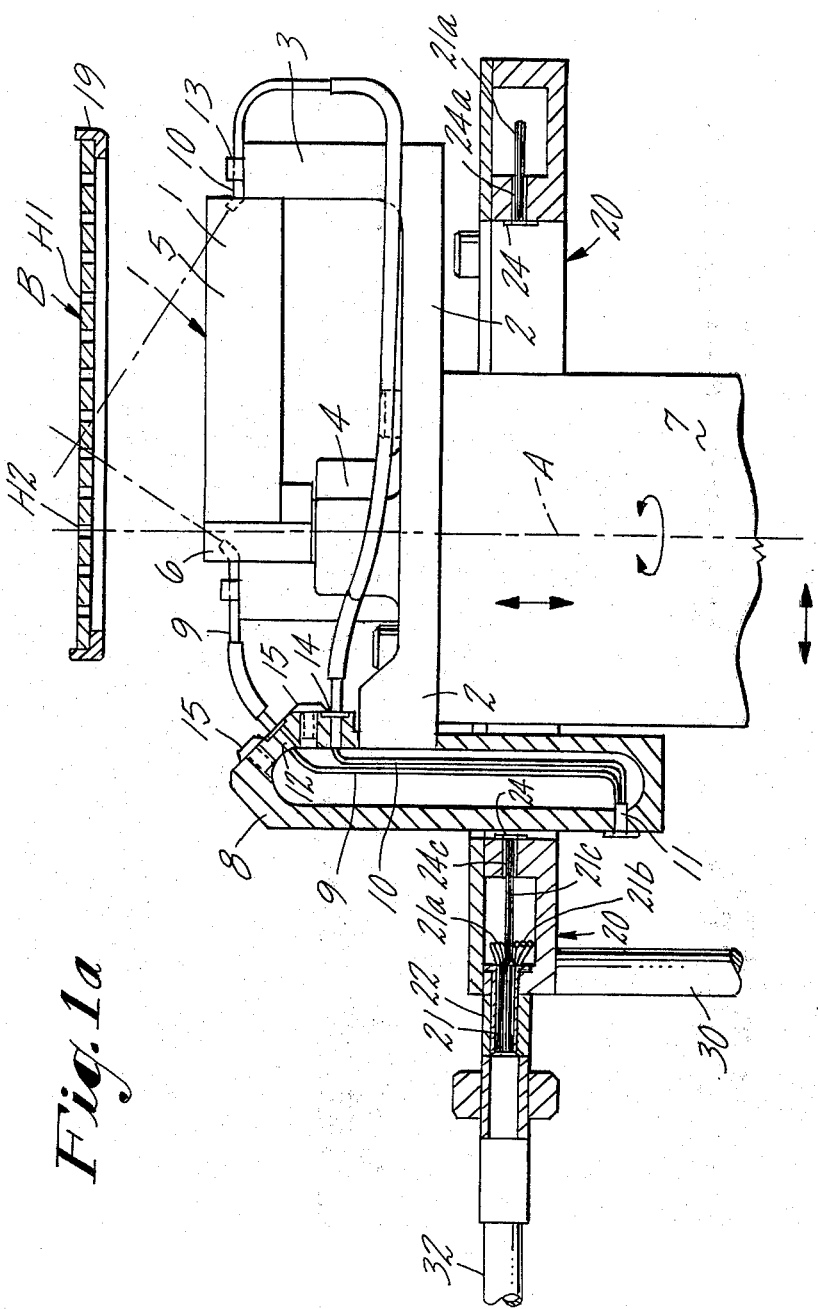

Referring to FIGS. 1a and 1b, the cut-clinch mechanism 1 is disposed upon a bracket 2 that has supports 3 and 4 extending therefrom. (The bracket 2 and supports 3 and 4 correspond to support 12 illustrated in the aforementioned U.S. Pat. No. 4,153,082). As described in my patent mentioned previously and shown in FIGS. 1, 2 and 3 thereof, the cut and clinch mechanism includes a pair of lead cutting and clinching levers pivotally carried on a shaft for counter rotation thereon during operation. The mechanism 1 of the present application is elevated for operation and supportive contact with a circuit board B disposed upon support bracket 19 through which leads of an electronic component (not shown) protrude to be cut and clinched. One lead of the component extends through a hole H2 in the circuit board B that is substantially in alignment with the axis of rotation of the cut-clinch mechanism 1 and into a shaft hole (FIG. 2, no. 41) when the mechanism is elevated. (The shaft hole 41 corresponds to the radial through-hole 14 illustrated in the aforementioned U.S. Pat. No. 4,153,082). The other lead of the component (pre-shaped to an appropriate length), is inserted in a second hole H1 in the circuit board B and thence into a slot (FIG. 2, no. 42) in the body 5 of the cut-clinch mechanism. (The slot 42 corresponds to the aligned through-slot 16 illustrated in the aforementioned U.S. Pat. No. 4,153,082). When the mechanism is operated, the lead-in wire extending into the head 6 of the cut-clinch mechanism will be sheared off and the portion still attached to component will be bent at a 90° angle and urged against the circuit board B. Simultaneously, the lead-in wire that extends into the body 5 of the cut-clinch mechanism 1 will also be sheared off and the portion still attached to the electronic component will be bent at a 90° angle, but opposite in direction to the first angle. By bending the lead-in wires in opposite directions, the electronic component is provided with a firm support. (The head 6 and body 5 of the cut-clinch mechanism correspond to the cutting and clinching levers 18 and 20, respectively, illustrated in the aforementioned U.S. Pat. No. 4,153,082. The head 6 and body 5 are adapted to be operated in the manner described in column 3, lines 3 to 36 of U.S. Pat. No. 4,153,082 and the disclosure of that patent concerning the details and operation of the cut-clinch mechanism are incorporated herein by reference).

Most ciruit board insertion stations use more than two and preferably four axial alignments for the cut-clinch mechanism 1. In order to obtain such orientations, bracket 2 is supported by post 7 that is rotatable about axis A. A light distributor 8 is carried by bracket 2 and rotates and elevates when post 7 is rotated or elevated. The light distributor 8 is a tubular member closed at both ends to enclose bundles of optical fibers 9 and 10. These bundles of optical fibers extend from an inlet port 11 which can be formed of a ferrule that snugly holds the fibers in place within the light distributor 8. The bundle is bifurcated within the light distributor and light emerges through ferrules 12 and 14, each of which holds one of the bifurcations.

The bundle of optical fibers 9 is attached to the head 6 of the cut-clinch mechanism 1 and is arranged to cast a light on the axis A when the apparatus is elevated to engage the circuit board B. Preferably, the bundle 9 is disposed in a fitting in the head 6 and the end 50 extends to the hole 41 mentioned previously into which a lead-in wire of the electronic component will be inserted. The other light bundle 10 extends within the light distributor 8 and through ferrule 14 which rigidly holds it in place. The bundle of fibers is attached to post 3 by clamp 13 and has an end 52 arranged to shine through the slot 42 in FIGS. 1A and 1B in the body 5 of the cut and clinch mechanism 1 (see FIG. 2). Ferrules 12 and 14 are securely held in place by screws 15 which engage their flange portions.

A light channel 20 is disposed about the periphery of post 7 and can move along a plane parallel to circuit board B as cut and clinch mechanism 1 moves into the various alignments. Preferably light channel 20 is supported by a post 30 disposed upon the same transit system (not shown) as post 7. The light channel 20 serves as a housing for four bundles of light transmitting optical fibers (only three of which are shown in FIG. 2, 21a, 21b and 21c). The main optical bundle 21 is disposed within a tube 22 and branches to individual light ports 24a–24c within light channel 20. These light ports at which the bundles 21a–21c terminate, are disposed upon the inner circumference of light channel 20 and are firmly held in place by ferrule 24 which form the light ports. When the cut and clinch mechanism 1 is raised to a position immediately beneath circuit board B, the light port 11 will be immediately in front of the light port 24c on light channel 20. In this way, light from optical bundle 21c will shine into light port 11. When cut and clinch mechanism 1 is rotated and moved to another position beneath circuit board B, light channel 20 will move with it in a plane parallel to board B. When cut and clinch mechanism 1 is rotated, light port 11 will be in registry with another light port 24 on light channel 20.

The light source for the bundle of optical fibers is fixed in a location (not shown) and transmitted into trunk 32 which is flexible and free to move as the cut-clinch mechanism moves about beneath circuit board B. The present requirements for insertion of electronic components into circuit boards indicate the use of four axial positionings and hence I use four light ports on channel 20. This number can be reduced or increased as desired, however, depending upon the complexity of the assembling equipment and the necessity for greater or lesser axial positionings.

As shown in FIG. 1a, the cut and clinch mechanism 1 is in a transit position relative to board B and light from bundles 9 and 10 will shine upwardly where the cut and clinch mechanism 1 is elevated to an active position (FIG. 1b) immediately beneath board B to receive an electronic component. In the active position the light from light bundle 9 shines directly into hole H2, light from bundle 10 shines through the slot formed in the body 5 of the cut and clinch mechanism 1 and forms a line of light directed towards the aperture H2. In this way the operator of the equipment can observe where to place one lead of the electronic component, that is in the brilliantly lit hole H2, and when the lead-in wires are pre-bent to the appropriate length, insert the other lead in hole H1 which is indicated by the line of light that provides for axial alignment. This relationship is best shown in FIG. 3 where hole H2 is brilliantly lit and disposed upon the axis of rotation of the head of the cut and clinch mechanism and the hole H1 is disposed upon a radial extension of that axis.

Referring to FIG. 2, the cut-clinch mechanism 1 is disposed upon bracket 2 which, in turn, is fixed on post 7 by four screws. The cut-clinch mechanism includes the head 6 and body 5 in which hole 41 and slot 42 are respectively disposed. Light from bundle 9 enters head 6 through a fitting and shines into hole 41 and light from bundle 10 enters into body 5 through a fitting and illuminates the length of slot 42. As the bracket 2 is rotated about an axis passing through hole 41, light distributor 8 indexes in front of one of the light ports 24 on light channel 20. Ferrule 11 indexes into optical contact with ferrule 24c that contains a quadrification of light bundle 21. When bracket 2 is rotated about the axis, it will index ferrule 11 in front of another ferrule 24, such as ferrule 24a, that is connected to light conduit 21a or ferrule 24b that is connected to bundle 21b. The fourth index position connected to the fourth branch of bundle 21 is also used although not shown in this Figure.

It is apparent that modifications and changes can be made within the spirit and scope of the present invention, but it is my intention, however, only to be limited by the scope of the appended claims.

As my invention, I claim:

1. Apparatus for securing a component having more than one lead-in wire to a circuit board containing a plurality of apertures disposed therein, said apparatus including:
   support means for said circuit board;
   securing means for affixing the component to said circuit board disposed on one side of said support means;
   means for moving said securing means relative to said support means;
   first illuminating means carried with said securing means and disposed on the same side of the support means as said securing means and arranged to illuminate an aperture of said circuit board that is substantially aligned with an aperture to indicate the intended location for one of said lead-in wires.

2. The apparatus according to claim 1 wherein the securing means pivots about an axis of rotation aligned with said aperture and said first illuminating means is directed to illuminate the aperture centered on said axis of rotation.

3. The apparatus according to claim 2 wherein a second illuminating means is also carried by said securing means and spaced from the first illuminating means and arranged to cast a line of light on said circuit board extending toward said axis so as to indicate a radial direction for insertion of a second lead-in wire.

4. Apparatus for securing a component having lead-in wires extending therefrom that are adapted to be inserted into apertures of a circuit board, the combination comprising:
   support means for receiving the circuit board;
   securing means disposed on one side of said support means, said securing means being reciprocatable on and rotatable about an axis;
   light distribution means carried by said securing means and arranged to reciprocate and rotate with said securing means;
   a light channel circumferentially disposed about said light distribution means;
   light output ports spaced from each other on said light channel, said light distribution means being arranged to reciprocate into optical contact with one of said light ports;
   illuminating means carried by said securing means and optically connected to said light channel through said light distribution means, said illuminating means arranged to illuminate a spot defined by the axis of rotation of said securing means whereby an aperture on said axis is identified for insertion of a lead-in wire.

5. The apparatus according to claim 4 wherein a second illuminating means is carried by said securing means and optically connected between said light channel through said light distribution means, the egress for light for said second illuminating means being spaced from the egress of the first illuminating means whereby radial alignment of said component can be identified.

6. The apparatus according to claim 5 wherein the light channel is a ring having equidistantly spaced light ports, said channel housing a plurality of bundles of light transmitting optical fibers, each of the bundles being connected to one of said light ports.

7. The apparatus according to claim 5, wherein the light distribution means contains a bifurcated bundle of light transmitting optical fibers, each one of the bifurcations being connected to one of the illuminating means.

8. Apparatus for securing a component having lead-in wires extending therefrom that are adapted to be inserted into apertures of a circuit board, the combination comprising:
   support means for receiving the circuit board;
   securing means including a hole and a slot disposed on one side of said support, said securing means being reciprocatable and rotatable about an axis passing through said hole;
   light distribution means carried by said securing means and arranged to reciprocate and rotate with said securing means;
   a light channel circumferentially disposed about the axis of rotation of said light distribution means;
   light output ports equidistantly spaced from each other on said light channel, said light distribution means being arranged to reciprocate into optical contact with one of said light ports;
   illuminating means carried by said securing means and optically connected to said light channel through said light distribution means, said illuminating means arranged to shine through said hole to illuminate a spot defined by the axis of rotation of said securing means whereby an aperture registered with said axis is identified for insertion of a lead-in wire.

9. The apparatus according to claim 8 wherein said securing means further includes a slot and a second illuminating means carried by said securing means and optically connected between said light channel through said light distribution means, the egress for light for said second illuminating means being disposed to shine light through said slot and form a line of light on one side of the board to identify radial alignment for the component.

10. The apparatus according to claim 9 wherein the light channel is a ring having four equidistantly spaced light distribution ports containing a quadrificated bundle of light transmitting optical fibers, each one of the quadrifications being connected to one of the light ports.

11. The apparatus according to claim 5, wherein the light distribution means is a bifurcated bundle of light transmitting optical fibers, each one of the bifurcations being connected to one of the illuminating means.

* * * * *